(12) United States Patent
Susa et al.

(10) Patent No.: US 6,778,624 B2
(45) Date of Patent: Aug. 17, 2004

(54) DIGITAL PLL-BASED DATA DETECTOR FOR RECORDED DATA REPRODUCTION FROM STORAGE MEDIUM

(75) Inventors: Naokazu Susa, Yokohama (JP); Ikuo Kano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 659 days.

(21) Appl. No.: 09/731,778

(22) Filed: Dec. 8, 2000

(65) Prior Publication Data

US 2001/0007583 A1 Jul. 12, 2001

(30) Foreign Application Priority Data

Dec. 8, 1999 (JP) .......................................... 11-348388

(51) Int. Cl.[7] .............................................. H03D 3/24
(52) U.S. Cl. ...................................... 375/376; 375/355
(58) Field of Search ................................. 375/294, 354, 375/355, 371, 372, 373, 374, 375, 376, 327; 360/81; 369/44.34; 327/141, 147, 150, 156, 159

(56) References Cited

U.S. PATENT DOCUMENTS 4,191,976 A * 3/1980 Braun ......................... 360/51

| | | | |
|---|---|---|---|
| 5,602,812 A | | 2/1997 | Miura et al. |
| 5,793,824 A | * | 8/1998 | Burch et al. ................. 375/372 |
| 6,104,682 A | * | 8/2000 | Konishi .................... 369/44.34 |

FOREIGN PATENT DOCUMENTS

| | | |
|---|---|---|
| JP | 8-36836 | 2/1996 |
| JP | 9-321615 | 12/1997 |
| TW | 278182 | 6/1996 |

* cited by examiner

*Primary Examiner*—Chieh M. Fan
(74) *Attorney, Agent, or Firm*—Clark & Brody

(57) ABSTRACT

An all digital PLL-based data detector for use in a disc media reproducer or recorder for receiving input read data read from a disc storage medium and providing an output sync signal and synchronized read data with jitter substantially eliminated. The PLL circuit is provided with a circuit for limiting the fed-back count value to a predetermined range so as to limit the internal sync signal to a desired range, a circuit for resetting a predetermined portion of the digital PLL-based circuit during an invalid period when input read data are expected to be invalid to thereby ensuring a normal operation after the invalid period, and/or a circuit for generating, from a given clock signal of a first frequency, a second clock signal of a second frequency different from the first frequency to thereby support a different data rate.

8 Claims, 5 Drawing Sheets

DIGITAL PLL-BASED DATA DETECTOR FOR RECORDED DATA REPRODUCTION FROM STORAGE MEDIUM

BACKGROUND OF THE INVENTION

1. Field of the Invention

The invention generally relates to a disc reproduction and/or recording system which at least reproduces recorded data recorded on a disc storage medium such as the optical disc, hard disc, floppy disc, etc. and, more particularly, to an all-digital PLL (phase locked loop) circuit for detecting the recorded data from a data sequence read out of the disc storage medium.

2. Description of the Prior Art

A read data sequence supplied from a recording and reproduction circuit in a disc medium drive usually includes the jitter and is hard to be processed as it is. For this reason, the reproduction of recorded data from a disc storage medium requires a PLL circuit for synchronizing the read data sequence to provide synchronized read data and a sync signal.

The present applicant disclosed an all-digital PLL circuit capable of stable operation at a low voltage of 3.3 V or under in Japanese unexamined patent publication No. 08036836 published Feb. 6, 1996. As the PLL circuit is composed of digital components only, it can be realized as an IC (integrated circuit) or a part of an IC which needs no external discrete component.

The present applicant also disclosed an improved digital PLL-base data detector in Japanese unexamined patent publication No. 09321615 published Dec. 12, 1997. The above-cited documents are hereby incorporated by reference.

However, there are still remaining the following problems in the prior art.

Since there is no limit in the range of frequency adjustable apart from a nominal data rate, input data with a large frequency deviation can cause the proposed PLL circuit to enter into an abnormal synchronization state.

If a series of invalid data are input to the proposed PLL circuit as occurs while the spindle motor is starting or the read/write head is moving, this will cause the numerical processing within the PLL circuit to become abnormal, which may make it uncertain whether the synchronization to a nominal data rate is successfully achieved after the input sequence has recovered valid or regular reproduction data.

The proposed PLL fails to support two or more nominal transmission rates.

SUMMARY OF THE INVENTION

The foregoing problems in the prior art have been solved in accordance with the present invention which provides a digital PLL circuit for use in a disc media reproducer or recorder for receiving input read data read from a disc storage medium and providing an output sync signal and synchronized read data with jitter substantially eliminated. The PLL circuit comprises means for generating a variable-rate internal sync signal, such as a down counter. The length of each period of the internal sync signal is determined as an initial count value supplied at the end of the previous period. A fiducial point is set at a fixed position of each period of the internal sync signal. For each pulse of the input read data, a phase difference between the input read data pulse and the fiducial point of an internal sync signal period concurrent with the input read data pulse is calculated by subtracting one from the other. A fed-back count value is calculated on the basis of the phase difference and phase differences calculated so far. An adder adds the fed-back count value to a given count value to obtain the initial count value. The internal sync signal is frequency-bisected into the output sync signal. The synchronized read data is generated from the input read data and the internal sync signal. The PLL circuit is further provided with a circuit for limiting the fed-back count value to a predetermined range so as to limit the internal sync signal to a desired range.

The PLL circuit may be further provided with a circuit for resetting a predetermined portion of the digital PLL-based circuit during an invalid period when input read data are expected to be invalid to thereby ensuring a normal operation after the invalid period, and/or a circuit for generating, from a given clock signal of a first frequency, a second clock signal of a second frequency different from the first frequency to thereby support a different data rate.

The inventive PLL circuit may be realized by using discrete components or as an IC (integrated circuit) or as a part of an IC. The digital PLL circuit may be incorporated in circuit boards such as various disc drive controllers.

BRIEF DESCRIPTION OF THE DRAWING

The features and advantages of the present invention will be apparent from the following description of an exemplary embodiment of the invention and the accompanying drawings, in which.

Throughout the drawing, the same elements when shown in more than one figure are designated by the same reference numerals.

DETAILED DESCRIPTION OF THE PREFERRED EMBODIMENTS

Figure 1:
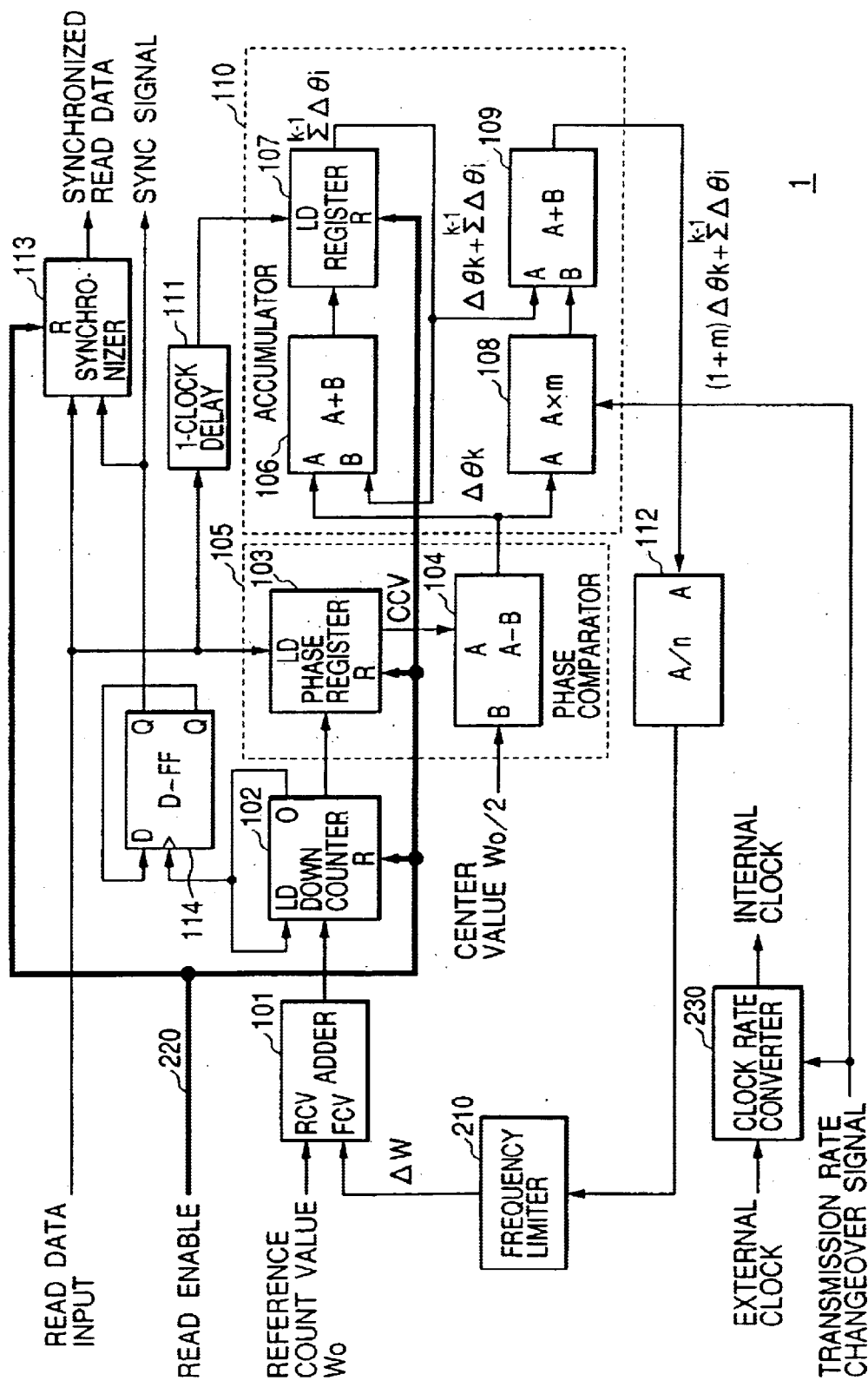
FIG. 1 is a schematic block diagram showing an exemplary arrangement of a digital PLL-based data detector in accordance with an illustrative embodiment of the invention.

FIG. 1 is a schematic block diagram showing an exemplary arrangement of a digital PLL-based data detector in accordance with an illustrative embodiment of the invention in which the principles of the invention have been applied to a conventional circuit of FIG. 8 of above-mentioned Japanese unexamined patent publication No. 09321615.

The data detector 1 of FIG. 1 is identical to the conventional circuit except that in FIG. 1:

a frequency limiter 210 (shown as a bold line block) has been inserted in a fed-back value (FBV) input line connected with a FBV input terminal of the adder 101;

read enable signal lines (shown in bold lines) 220 have been added, as initial phase adjusting means, which supply a read enable signal 220 to the reset terminals of a down counter 102, a phase register 103, an accumulator register 107 and a synchronizer 113 to reset them; and a clock rate converter 230 (shown as a bold line block) has been added which converts an external clock given from the external into an internal clock of a desired rate in response to a transmission rate changeover signal which is given from the host system and which is also supplied to a multiplier (denoted "m" in this example) setting input of a multiplier 108.

Figure 2:
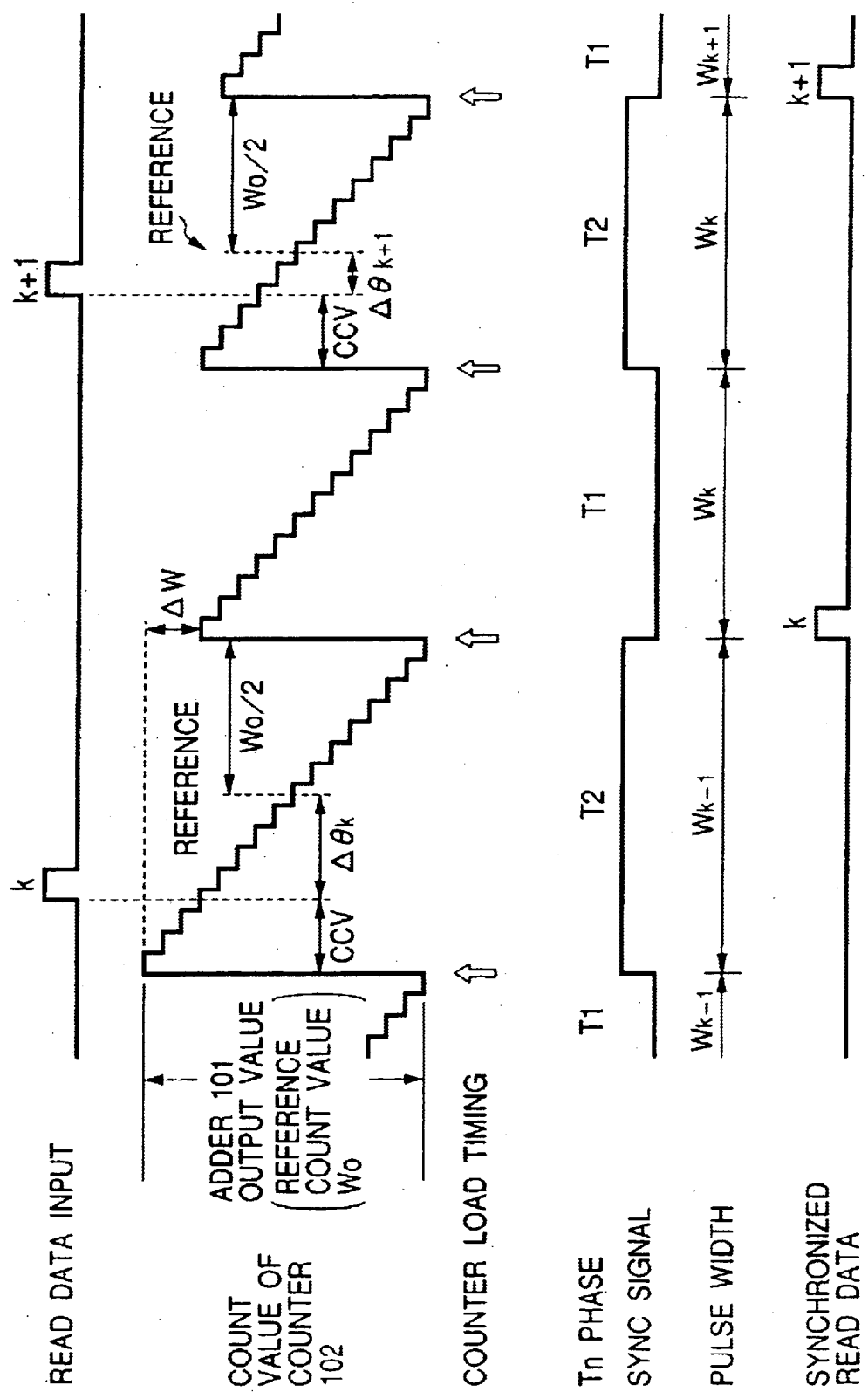
FIG. 2 is a diagram for illustrating the fundamental operation of the data detectors 1 and 2 of FIGS. 1 and 6.

For the sake of better understanding the invention, we briefly review the operation of the fundamental portion of the data detector 1 referring to FIGS. 1 and 2.

The adder 101 adds a fed-back count value (labeled "ΔW" in FIGS. 1 and 2) to the reference count value W0 supplied from a host system or controller. The down counter 102 is so arranged as to count the given clock pulses down from the initial value which, when the counter 102 reaches zero, is loaded thereinto as shown by bold arrows in FIG. 2. That is, when the value of the counter 102 is zero, the down counter 102 reads the current value of the adder 101 (or the initial count value), counts the given clock pulses down to zero, responsively reads the current value of the adder 101 again, and so on. This results in the count value of counter 102 as shown in FIG. 2.

It is noted that the initial count value determines the window or range in which a comparison is made between the position of the received pulse and the fiducial point within the window. The fiducial point is set to the half of the reference count value Wo, i.e., Wo/2.

When a pulse (e.g., "k" in FIG. 2) is received, the phase register 103 responsively reads or captures the current count value from the counter 102 to pass the captured count value CCV to a subtracter 104, which subtracts the fiducial count value (Wo/2) from the captured count value CCV to provide a value indicative of the phase difference between the received pulse and the fiducial point. The phase difference for the pulse k is denoted by Δθk in FIGS. 1 and 2. As seen from FIG. 2, the phase difference Δθk is positive if a pulse is received before the counter 102 reaches the fiducial count value Wo/2 and negative if the pulse is received after the counter 102 has passed the fiducial count value Wo/2.

The phase difference Δθk is supplied to an accumulator comprised of an adder 106, a 1-clock delay 111 and a register 107 and to a multiplier 108. At this point of time, the register retains the sum of the phase differences from first to previous ones, i.e., $$\sum_{i=1}^{k-1} \Delta\theta_i.$$

After accumulation of Δθk in the accumulator (106, 107 and 111) and the multiplication of Δθk by a first constant m in the multiplier 108, the results are added together by the adder 109 to yield a weighted sum:

$$(1+m)\Delta\theta k + \sum_{i=1}^{k-1} \Delta\theta_i.$$

The weighted sum is divided by a second constant n in the divider 112, which provide the quotient. Since the quotient is fed back to one (FCV) of the input terminals of the adder 101, the quotient is also referred to as the "fed-back count value" and denoted by ΔW. In this way, the fed-back count value ΔW is calculated based on a weighted sum of the phase differences and the constants m and n by means of elements 106 through 112.

The fed-back count value ΔW is added to the reference count value Wo by the adder 101 to yield the sum of Wo and ΔW, which is used as an initial count value for the next counter cycle. (A counter cycle means a process from an initial count value load to the end of a counting down operation to zero by the counter 102.) Through this process, the frequency of the counter cycles by the counter 102 is synchronized to integer times of the frequency of the read data input pulses. A signal which becomes high when the counter 102 value is zero is output through a ½ divider 114 as a sync signal. Using the sync signal, a synchronizer 113 generates synchronized read data from the read data input as shown in FIG. 2.

Figure 3:
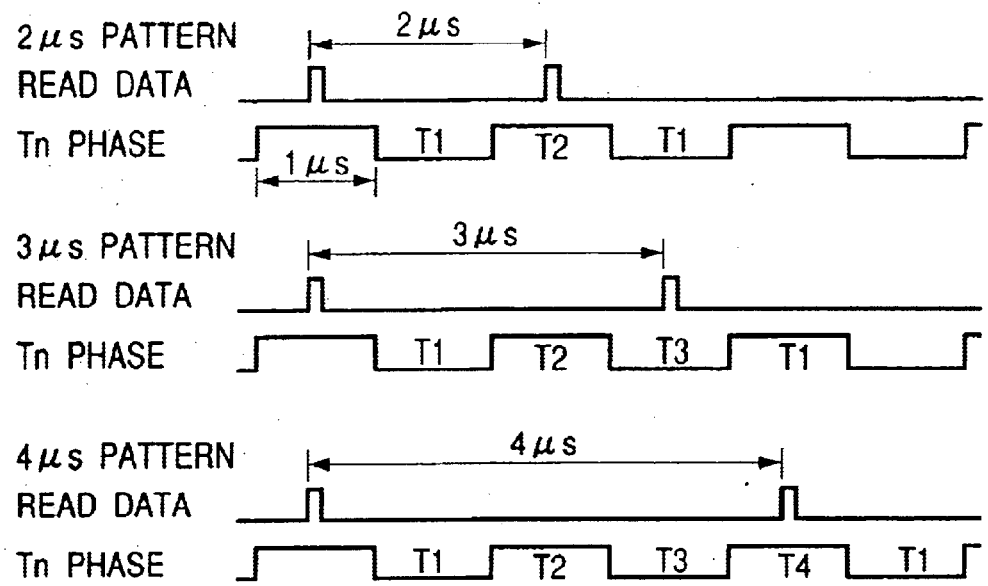
FIG. 3 is a diagram showing waveforms for three of the possible synchronous states of the PLL circuits 1 and 2.
Figure 4:
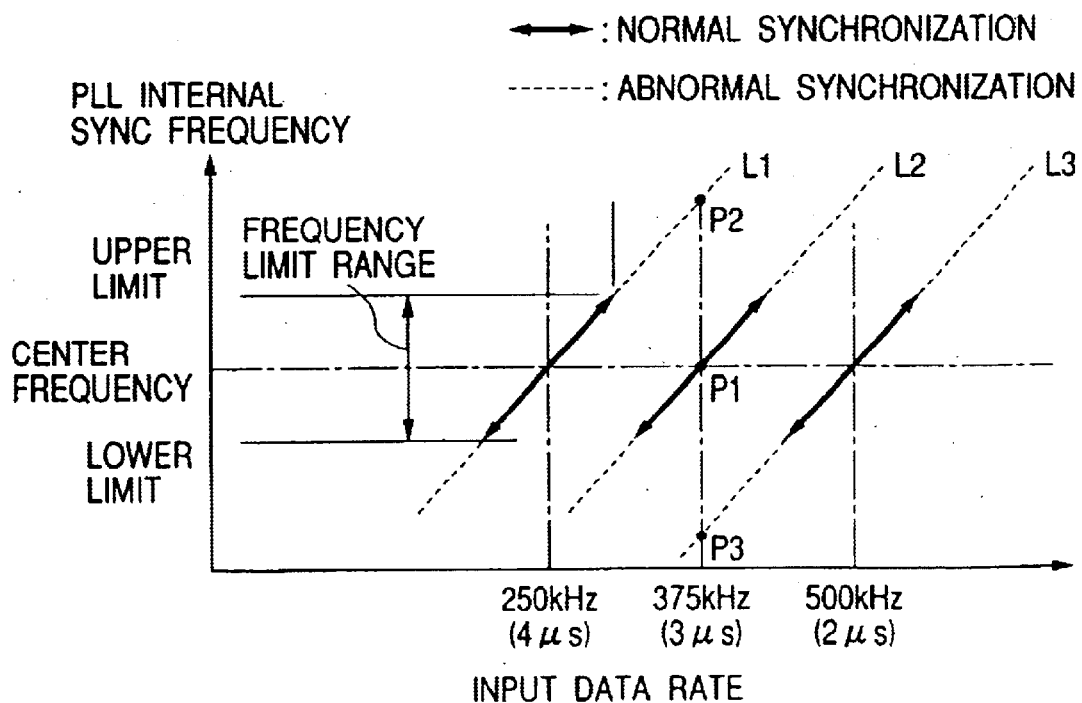
FIG. 4 is a graph showing normal frequency ranges for the three synchronous states of FIG. 3.

Referring to FIGS. 3 and 4, the function of the frequency limiter 210 will be described. As described above, the PLL circuit 1 can have synchronous states of integer times of the frequency of the read data input pulses. Three typical synchronous patterns, e.g., 2 to 4 μs patterns, are shown in FIG. 3. Since the period of each counter cycle is set to 1 μs in this specific example, two counter cycles (Tn phases) T1 and T2 with the same pulse width follow each pulse of the read data input in the 2 μs pattern. The pulse width is determined by the position of the pulse in the counter cycle where the pulse lies. In the same manner, the 3 μs pattern spends three counter cycles T1 through T3 for each input pulse; and the 4 μs pattern spends four counter cycles T1 through T4 for each input pulse.

In FIG. 4, lines L1 through L3 show, for the three synchronous patterns, the relationship between the input data rate and an internal sync signal frequency such as the 0-count signal of the counter 102. The input data rates are 250 KHz (for 4 μs pattern), 375 KHz (for 3 μs pattern), and 500 KHz (for 2 μs pattern). If the PLL circuit 1 is synchronized to the read data input of about 375 KHz in the 3 μs pattern for example, then the counter 102 of the PLL circuit 1 repeats count down processes at about the center frequency (i.e., at about 1 MHz in this specific example). The operating point in this case is shown by point P1 on line L2. A change in the frequency of read data input causes the operating point to move along line L2.

As seen from FIG. 4, for the read data input of about 375 KHz, the PLL circuit 1 can also operate with the operating point set to point P2 or P3. However, such operating conditions are undesirable because the operating point deviates far from the center frequency. The bold arrows on limes L1 through L3 indicate preferable ranges of the operating point for the three synchronous patterns. The bold arrows are in a range bounded by "LOWER LIMIT" and "UPPER LIMIT" in the PLL internal sync frequency axis.

For this reason, the frequency limiter 210 limits the fed-back count value supplied to the FCV input of the adder 101 such that the frequency of the 0-count signal from the counter 102 is in the range from the lower limit to the upper limit. Since the period of each counter cycle of the counter 102 is 1 μs as mentioned above, if the reference count cycle Wo is set to 16 counts, then this means that a 16 MHz clock is supplied to a not-shown clock input terminal of the counter 102. If the permitted internal sync frequency is to be set to ±25% of the center internal sync frequency, i.e., 1 MHz, then the frequency limiter 210 has only to limits the fed-back count value to ±4.

Setting the limited range of the limiter 210 to a smaller value results in a narrower adjustable frequency range of the PLL circuit 1, while too large a limiter 210 range may cause an abnormal synchronization as shown by dotted lines in FIG. 4. For this reason, it is necessary to set the limiter 210 range to an appropriate value for an expected frequency of the read data input.

Figure 5:
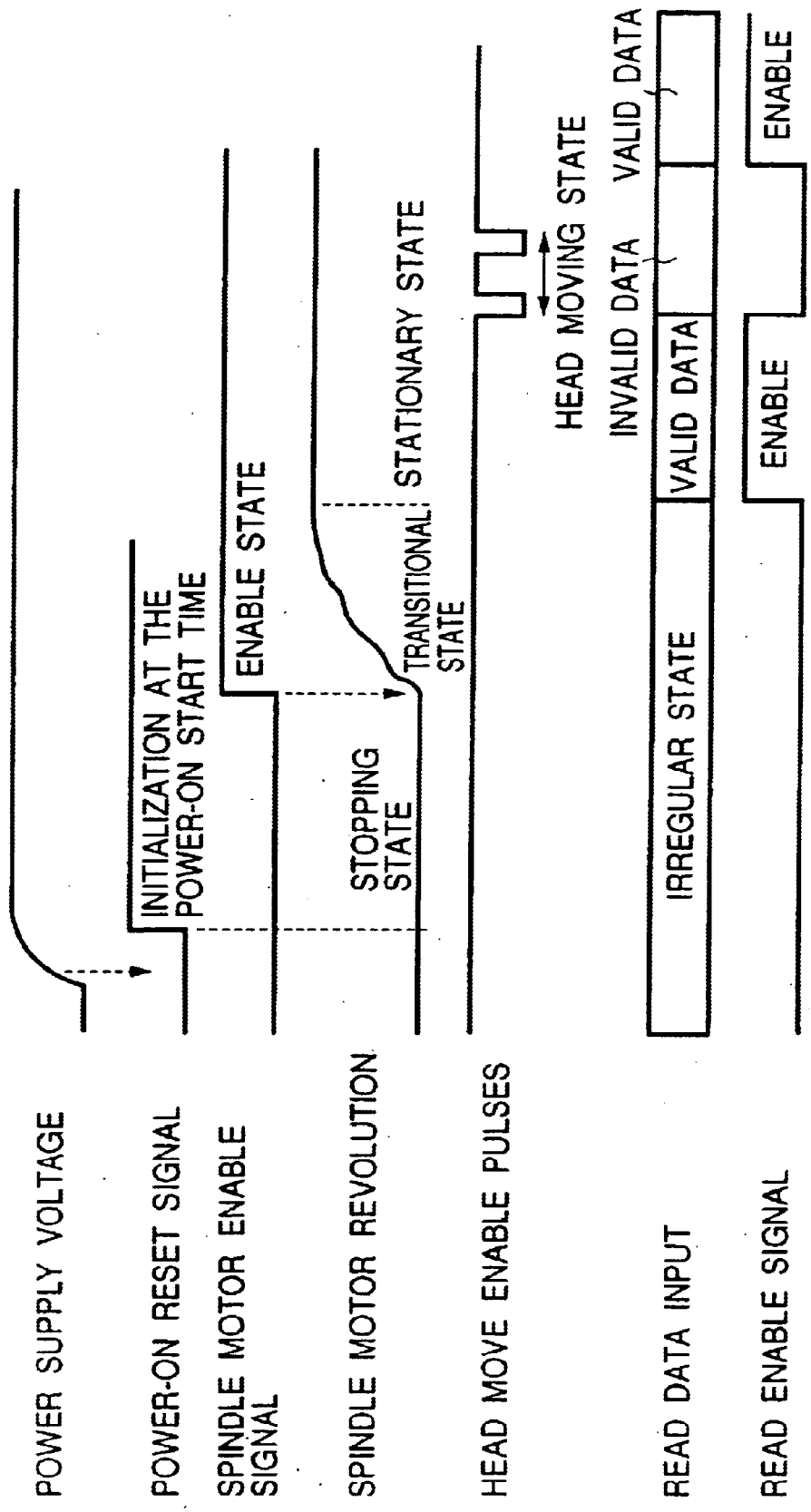
FIG. 5 shows waveforms for illustrating the function of a read enable signal.

FIG. 5 is a diagram showing waveforms for illustrating the function of a read enable signal 220. In FIG. 5, an irregular state of the read data input starts at the beginning of the power supply voltage and continues through an initialization responsive to a power-on reset and a transitional state of spindle motor revolution initiated by a spindle motor enable signal until the spindle motor revolution reaches a stationary state. The read enable signal is kept low to indicate a disable state during the irregular state. In response to the end of the irregular state, the read enable signal is set high to indicate an enable state.

Since the read data input is invalid during a head moving state, even if the spindle motor revolution is in a stationary state, the read enable signal 220 is also set low during the periods when valid read data are not expected due to a head moving operation. That is, the read enable signal 220 is kept high only when the read data input is valid.

The read enable signal 220 is supplied to the reset terminals of down counter 102, phase register 103, accumulator register 107 and synchronizer 113 to reset them during the logical zero states of the read enable signal 220. It is preferable to load the RVC input terminal of the adder 101 with the half of the reference count value, i.e., Wo/2 instead of Wo while the read enable signal 220 is low. Doing this makes it possible to shorten the time it takes the PLL circuit 1 to synchronize to the read data input.

Further, as shown in FIG. 1, providing the digital PLL-based data detector 1 with the clock rate converter 230 enables easily supporting a plurality of different frequencies of the read data input, i.e., recording media of different data rates. If a clock signal of 16 MHz is used for the read data input of 500 KHz in data rate and if the data rate of the read data input is to be changed to 250 KHz, what has to be done is only supplying an appropriate transmission rate changeover signal to the clock rate converter 230, causing it to change the internal clock rate from 16 MHz to 8 MHz.

When the internal clock rate is changed, it is preferable to adjust the weight value m used in the multiplier 108 so as to optimize the transitional characteristics of the PLL circuit 1. A larger value of the weight m results in quicker response and more jitter of an internal sync signal such as the 0-count signal from the counter 102. On the other hand, a smaller value of m yields the opposite results.

Figure 6:
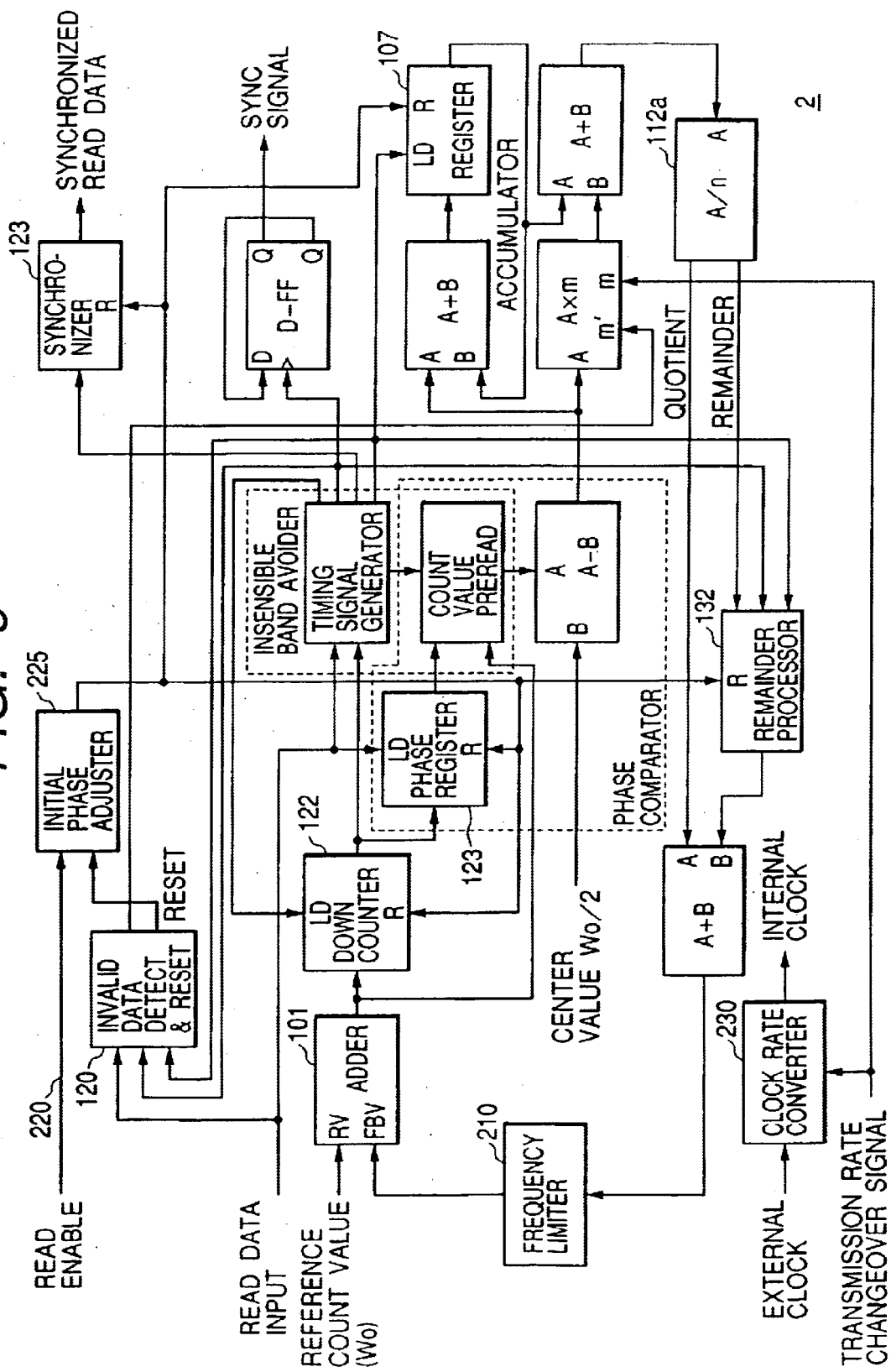
FIG. 6 is a schematic block diagram showing an exemplary arrangement of a digital PLL-based data detector in accordance with another illustrative embodiment of the invention.

FIG. 6 is a schematic block diagram showing an exemplary arrangement of a digital PLL-based data detector in accordance with another illustrative embodiment of the invention in which the principles of the invention have been applied to a conventional circuit of FIG. 1 of above-mentioned Japanese unexamined patent publication No. 09321615.

As for the frequency limiter 210 and the clock rate converter 230, the digital PLL-based data detector 2 of FIG. 6 is identical to the conventional circuit.

The data detector 2 only differs from the conventional circuit in that the data detector 2 is provided with an initial phase adjuster 225. In connection with the incorporation of the initial phase adjuster 225, the read enable signal 220 is supplied to an input terminal of the initial phase adjuster 225; a reset output of an invalid data detector & reset circuit 120 is supplied to the other input terminal of the initial phase adjuster 225, and the initial phase adjuster 225 output is supplied to the reset terminal of a remainder processor 132 as well as the reset terminals of down counter 102, phase register 103, accumulator register 107 and a synchronizer 123. The initial phase adjuster 225 only provides the logical sum of the read enable signal 220 and the invalid data detector & reset circuit 120 reset output. This prevents the PLL-based data detector 2 from operating on the invalid data of the read data input by resetting the elements 102, 103, 107, 123 and 132, ensuring the synchronization of the data detector 2 after the resetting.

The foregoing merely illustrates the principles of the invention. Many widely different embodiments of the present invention may be constructed without departing from the spirit and scope of the present invention.

For example, the circuits 1 and 2 of FIGS. 1 and 6 may be either realized by using discrete components or realized as an IC (integrated circuit) such as an ordinary IC, a DSP (digital signal processor), an ASIC (application specific IC), etc. or as a part of such an IC.

The digital PLL-based data detectors 1 and 2 may be incorporated in circuit boards such as various disc drive controllers.

Therefore, it should be understood that the present invention is not limited to the specific embodiments described in the specification, except as defined in the appended claims.

What is claimed is:

1. A digital PLL circuit for receiving input read data read from a disc storage medium and providing an output sync signal and synchronized read data with jitter substantially eliminated, the circuit comprising:

means for generating a variable-rate internal sync signal, a length of each period of said internal sync signal being determined as an initial count value supplied at the end of a previous period, and a fiducial point being set at a fixed position of each period of said internal sync signal;

means for calculating, for each pulse of said input read data, a phase difference between the input read data pulse and said fiducial point of an internal sync signal period concurrent with said input read data pulse by subtracting one from the other;

means for calculating a fed-back count value on the basis of said phase difference and phase differences calculated so far;

adding means for adding said fed-back count value to a given count value to obtain said initial count value;

means for frequency-bisecting said internal sync signal into said output sync signal;

means for generating said synchronized read data from said input read data and said output sync signal; and means for limiting said fed-back count value to a predetermined range so as to limit said internal sync signal to a desired range.

2. The digital PLL circuit as defined in claim 1, further comprising:

means for resetting a predetermined portion of the digital PLL-based circuit during an invalid period when said input read data are expected to be invalid to thereby ensuring a normal operation after said invalid period.

3. The digital PLL circuit as defined in claim 2, wherein said adding means is given half of said given count value instead of said given count value in order to shorten a time needed for recovering a stationary state.

4. The digital PLL circuit as defined in claim 1, further comprising:

means for generating, from a given clock signal of a first frequency, a second clock signal of a second frequency different from said first frequency to thereby support a second disc storage medium different in data rate from said disc storage medium.

5. An integrated circuit incorporating a digital PLL circuit for receiving input read data read from a disc storage medium and providing an output sync signal and synchronized read data with jitter substantially eliminated, the digital PLL circuit comprising:

means for generating a variable-rate internal sync signal, a length of each period of said internal sync signal being determined as an initial count value supplied at the end of a previous period, and a fiducial point being set at a fixed position of each period of said internal sync signal;

means for calculating, for each pulse of said input read data, a phase difference between the input read data pulse and said fiducial point of an internal sync signal period concurrent with said input read data pulse by subtracting one from the other;

means for calculating a fed-back count value on the basis of said phase difference and phase differences calculated so far;

adding means for adding said fed-back count value to a given count value to obtain said initial count value;

means for frequency-bisecting said internal sync signal into said output sync signal;

means for generating said synchronized read data from said input read data and said output sync signal; and means for limiting said fed-back count value to a predetermined range so as to limit said internal sync signal to a desired range.

6. The digital PLL circuit as defined in claim 5, further comprising:

means for resetting a predetermined portion of the digital PLL-based circuit during an invalid period when said input read data are expected to be invalid to thereby ensuring a normal operation after said invalid period.

7. The digital PLL circuit as defined in claim 6, wherein said adding means is given half of said given count value instead of said given count value in order to shorten a time needed for recovering a stationary state.

8. The digital PLL circuit as defined in claim 5, further comprising:

means for generating, from a given clock signal of a first frequency, a second clock signal of a second frequency different from said first frequency to thereby support a second disc storage medium different in data rate from said disc storage medium.

* * * * *